United States Patent [19]

Okamoto

[11] Patent Number: 5,284,735
[45] Date of Patent: Feb. 8, 1994

[54] PHOTOPOLYMERIZABLE COMPOSITION

[75] Inventor: Hiroaki Okamoto, Warabi, Japan

[73] Assignee: Okamoto Chemical Industry Co., Ltd., Saitama, Japan

[21] Appl. No.: 12,218

[22] Filed: Feb. 2, 1993

[30] Foreign Application Priority Data

Mar. 6, 1992 [JP] Japan .................... 4-049185

[51] Int. Cl.$^5$ .............................. G03C 1/725
[52] U.S. Cl. ....................... 430/281; 430/919; 430/920; 430/921; 522/9; 522/26; 522/27; 522/28
[58] Field of Search ........... 430/281, 919, 920, 921; 522/9, 26, 27, 28

[56] References Cited

U.S. PATENT DOCUMENTS 4,298,679 11/1981 Shinozaki et al. ............... 430/919
4,594,310 6/1986 Nagasaka ...................... 430/920

Primary Examiner—Jack P. Brammer
Attorney, Agent, or Firm—Anderson Kill Olick & Oshinsky

[57] ABSTRACT

A photopolymerizable composition having high sensitivity and broad development latitude comprises a radical-polymerizable compound having two or more ethylenically unsaturated double bonds in the molecule, a photoinitiator, an organic high-molecular compound, and a substituted ethylene compound.

2 Claims, 1 Drawing Sheet

PHOTOPOLYMERIZABLE COMPOSITION

FIELD OF THE INVENTION AND RELATED ART STATEMENT

This invention relates to a photopolymerizable composition which comprises a radical-polymerizable compound, a photoinitiator, and an organic high-molecular compound and which, in addition, contains a certain photoinitiator. More particularly, the invention concerns a photopolymerizable composition useful, e.g., in forming the photosensitive layer of a photosensitive printing plate that can respond with high sensitivity to argon laser beams.

Many photopolymerizable compositions have been known which comprise an ethylenic double bond-containing compound capable of undergoing addition polymerization, a photoinitiator, and, where necessary, an organic high-molecular compound.

The photoinitiators usually used in those photopolymerizable compositions include benzoin, benzoin alkyl ethers, benzophenone, anthraquinone, Michler's ketone, and acridine.

They are excellently capable of initiating photopolymerization with a light source in the ultraviolet spectral range below 400 nm. Their initiation capacities decrease sharply, however, with light in the visible range of 400 nm and upwards.

To overcome this deficiency, some composite photoinitiators each combining two or more compounds have been introduced.

Examples are the combinations of: a bis(p-aminophenylunsaturated) ketone and an imidazole (U.S. Pat. No. 3,652,275); a substituted triazine and a merocyanine colorant (Japanese Patent Provisional Publication No. SHO 54-151024); 3-keto-substituted cumalin compound and an activated halogen compound (Japanese Patent Provisional Publication No. SHO 58-15503); a thiopyrylium salt and an S-triazine derivative (Japanese Patent Provisional Publication No. SHO 58-40302); 4,4'-bis(dialkylamino)benzophenone, benzophenone, and an organic halogen compound (Japanese Patent Provisional Publication No. SHO 59-78339); hexaarylbisimidazole, 3-keto-substituted cumalin compound, and a thiol compound and/or amine compound (Japanese Patent Provisional Publication No. SHO 61-123603); a p-aminophenyl unsaturated ketone, a borate compound, and a xanthene compound and/or pyrylium salt (Japanese Patent Provisional Publication No. HEI 2-157760); a metallic arene compound and an organic colorant (Japanese Patent Provisional Publication No. HEI 3-39747); and an organic colorant and an organic peroxide (Japanese Patent Provisional Publication No. HEI 3-61983).

The photopolymerizable compositions using these composite photoinitiators are not fully satisfactory yet in respect of the photosensitive speed and have to be further improved.

In view of this, we previously proposed a photopolymerizable composition having a high sensitivity (in our copending Patent Application No. HEI 3-268302 (or 268302/1991)). However, it had some drawbacks with regard to development latitude.

OBJECT AND SUMMARY OF THE INVENTION

An object of the present invention, therefore, is to provide a photopolymerizable composition having a high sensitivity and yet a broad development latitude.

To order to realize the object, intensive investigations have been made. It has now been found, as a result, that photopolymerizable composition having an outstandingly high sensitivity also in the long wavelength range as well as a broad development latitude can be obtained by combining a photoinitiator of a composite system which consists, e.g., of a bis(p-aminophenyl-unsaturated) ketone, an organophosphorus compound, and a thiol compound (mercapto derivative), with a certain substituted ethylene compound. The discovery has led to the present invention.

The present invention thus provides a photopolymerizable composition characterized by a radical-polymerizable compound having two or more ethylenically unsaturated double bonds in the molecule, a photoinitiator, an organic high-molecular compound, and a substituted ethylene compound of the general formula (I) or (II):

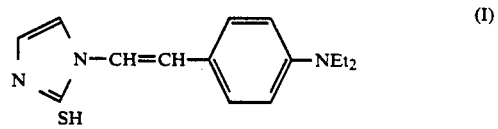

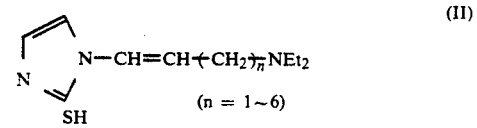

The radical-polymerizable compound having two or more ethylenically unsaturated double bonds in the molecule (hereinafter called "the radical-polymerizable compound" of the invention) is, e.g., ethylene glycol diacrylate, ethylene glycol dimethacrylate, diethylene glycol diacrylate, diethylene glycol dimethacrylate, triethylene glycol diacrylate, triethylene glycol dimethacrylate, polyethylene glycol diacrylate, polyethylene glycol dimethacrylate, butylene glycol dimethacrylate, hexanediol diacrylate, hexanediol dimethacrylate, neopentyldiol diacrylate, neopentyldiol dimethacrylate, polypropylene glycol diacrylate, methoxydiethylene glycol methacrylate, methoxytetraethylene glycol methacrylate, methoxypolyethylene glycol methacrylate, trimethylolpropane triacrylate, trimethylolpropane trimethacrylate, pentaerythritol diacrylate, pentaerythritol dimethacrylate, pentaerythritol triacrylate, pentaerythritol trimethacrylate, pentaerythritol tetraacrylate, pentaerythritol tetramethacrylate, and dipentaerythritol hexaacrylate.

The amount of the radical-polymerizable compound of the invention to be contained is desirably from 10 to 70 percent by weight, more desirably from 20 to 60 percent by weight, on the basis of the total amount of the photopolymerizable composition according to the invention.

As for the photoinitiator for use in the present invention, any of conventional products may suitably be used. Among useful photoinitiators are bis(p-aminophenyl-unsaturated) ketones, organophosphorus compounds such as triphenylphosphine and quaternary phosphonium salt, mercapto derivatives, tetrazonium derivatives, carbonyl compounds, peroxides, halogenated compounds, and sensitizing colorants.

Examples of the bis(p-aminophenyl-unsaturated) ketones are 2,6-bis(4'-dimethylaminobenzylidene) cyclohexanone, 2,5-bis(4'-dimethylaminobenzylidene) cyclopentanone, 2,5-bis(4'-diethylaminobenzylidene) cyclopentanone, 2,6-bis(4'-diethyl-amino-2'-methylbenzylidene) cyclohexanone, 2,5-bis(4'-di-ethylamino-2'-methylbenzylidene) cyclopentanone, and 2,5-bis(4'-dimethylaminocinnamylidene) cyclopentanone.

Examples of the organophosphorus compounds are triphenylphosphine, allyltriphenylphosphonium bromide, allyltriphenylphosphonium chloride, n-amyltriphenylphosphonium chloride, benzyltriphenylphosphonium chloride, bromomethyltriphenylphosphonium bromide, and n-butyltriphenylphosphonium bromide.

Examples of the mercapto derivatives are 2-mercaptobenzoimidazole, 2-mercaptobenzothiazole, and 2-mercaptobenzoxazole.

Examples of the tetrazonium derivatives are 2,3-diphenyl-5-(p-diphenyl)tetrazolium chloride, 2,5-diphenyl-3-(p-diphenyl)tetrazolium chloride, 2,3-diphenyl-5-ethyltetrazolium chloride, 2,3-diphenyl-5-(m-hydroxyphenyl)tetrazolium chloride, 2,3-diphenyl-5-(p-methoxyphenyl)tetrazolium chloride, 2,3-diphenyl-5-methoxytetrazolium chloride, 2,5-diphenyl-3-(4-nitro-1-naphthyl)tetrazolium chloride, 2,5-diphenyl-3-(p-phenylazophenyl)tetrazolium chloride, 2,5-diphenyl-3-(4-styrylphenyl)tetrazolium chloride, 2,3-di-phenyltetrazolium perchloride, 2,3-diphenyl-5-thienyl-(2)-tetrazolium chloride, 2,3-diphenyl-5-(p-tolyl)tetrazolium chloride, 2,5-diphenyl-3-(4-trimethylammonium indole)phenyltetrazolium chloride, 2,3-di(p-tolyl)-5-phenyltetrazolium chloride, 2,5-diphenyl(p-tolyl)-3-phenyltetrazolium chloride, 2,5-diphenyl-3-(p-(o-tolyl)azo-o-tolyl)tetrazolium chloride, and 2-(p-iodophenyl)-3-(p-nitrophenyl)-5-phenyl-2H-tetrazolium chloride.

Examples of the carbonyl compounds are benzoin, benzoin isopropyl ether, benzyldimethylketal, benzophenone, 4,4'-bis(dimethylamino)benzophenone, 4,4'-bis(diethylamino)benzophenone, 1-hydroxycyclohexylphenyl ketone, and 2-methyl- [4-(methylthio)phenyl]-2-morpholino-propane.

Examples of the peroxides are di-t-butyl peroxide, benzoyl peroxide, 1,3-di(t-butyldioxycarbonyl)benzene, and 3,3',4,4'-tetrakis(t-butyloxycarbonyl)benzophenone.

Examples of the halogenated compounds are 2,4,6-tri-(trichloromethyl)-s-triazine, 2-phenyl-4,6-bis(trichloromethyl)-s-triazine, and 2-naphthyl-4,6-bis(trichloromethyl)-s-triazine.

Examples of the sensitizing colorants are xanthene dyes, merocyanine dyes, cumalin and ketocumalin dyes.

The amount of the photoinitiator to be added in accordance with the invention is desirably from 0.1 to 50 percent by weight, more desirably from 1 to 30 percent by weight, on the basis of the amount of the radical-polymerizable compound of the invention.

If the amount of the photoinitiator is less than 0.1 percent by weight the effect of addition is nil. If it exceeds 50 percent by weight the initiator can cause troubles including shutoff of usable light.

The organic high-molecular compound for use in the present invention is not limited to a specific type provided it is compatible with the photopolymerizable ethylenically unsaturated compound to be used together.

A desirable organic high-molecular compound is one soluble in or swellable with a weakly alkaline aqueous solution, thus permitting alkalescent aqueous development.

Exemplary organic high-molecular compounds are acrylic acid copolymers, methacrylic acid copolymers, itaconic acid copolymers, crotonic acid copolymers, copolymers of alkyl methacrylates and acrylonitrile, acrylic acid, methacrylic acid, styrene, etc., copolymers of 2-hydroxyethyl methacrylate and acrylonitrile, methyl methacrylate, etc., copolymers of 2-hydroxypropyl methacrylate and acrylonitrile or methyl methacrylate, polyvinyl pyrrolidone, ethylene-vinyl acetate copolymer, styrene-maleic anhydride copolymer and its partially esterified product, polyhydroxystyrene, p-isopropenylphenol copolymer, phenol or cresol resin, and p-hydroxymaleimide copolymer.

The content of such an organic high-molecular compound desirably ranges from 20 to 85 percent by weight, more desirably from 30 to 70 percent by weight, on the basis of the total amount of the photopolymerizable composition of the invention.

The substituted ethylene compound to be used under the invention, which is represented by the general formula (I) or (II), (hereinafter called "the substituted ethylene compound" of the invention) is any of the compounds having the following structural formulas (1) to (7):

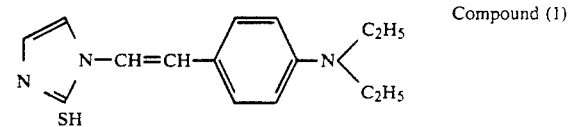

Compound (1)

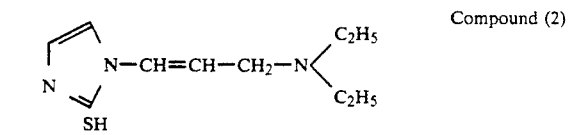

Compound (2)

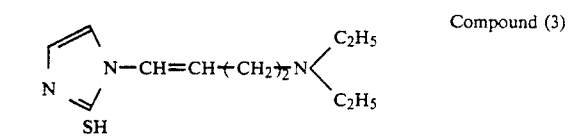

Compound (3)

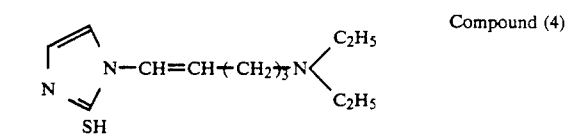

Compound (4)

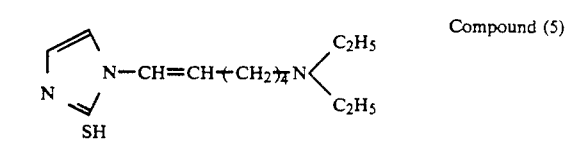

Compound (5)

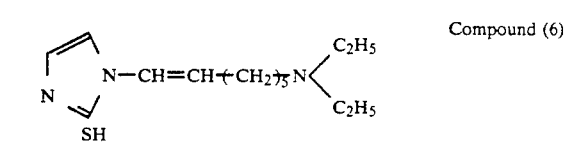

Compound (6)

-continued

Compound (7)

The amount of the substituted ethylene compound to be contained is desirably between 0.01 and 20 percent by weight, more desirably between 0.1 and 15 percent by weight, on the basis of the total amount of the photopolymerizable composition.

The photopolymerizable composition of the invention may contain N-phenylglycine, acrylamide, etc. to enhance its sensitivity and broaden its development latitude.

In addition to the basic components, the composition of the invention may also incorporate a thermal polymerization inhibitor, coloring agent (dye or pigment), plasticizer, surface active agent, and other additives, if necessary. Use of these additives permits the fabrication of the composition into a lithographic plate, letterpress plate, photoresist, etc. as desired.

The thermal polymerization inhibitor, when used, is added in a small amount to avoid unnecessary thermal polymerization of the photopolymerizable composition of the invention during preparation or storage.

Suitable thermal polymerization inhibitors include hydroquinone, p-methoxyphenol, pyrogallol, t-butylcatechol, and di-t-butyl-p-cresol.

The amount of such a thermal polymerization inhibitor to be added is from 0 to 5 percent by weight, preferably from 0.1 to 3 percent by weight, on the basis of the total amount of the photopolymerizable composition of the invention.

The dye or/and pigment are added to color the photopolymerizable composition of the invention.

The amount of the dye or/and pigment is between 0 and 10 percent by weight, preferably between 0.1 and 5 percent by weight, on the basis of the total amount of the photopolymerizable composition of the invention.

The plasticizer and surface active agent are added with the view of improving the coating properties or adhesion to the base of the photopolymerizable composition of the invention.

Typical plasticizers are dimethyl phthalate, diethyl phthalate, dibutyl phthalate, diheptyl phthalate, di-2-ethylhexyl phthalate, di-n-octyl phthalate, diisodecyl phthalate, butylbenzyl phthalate, diisononyl phthalate, ethyl phthalylethyl glycol, and dimethyl isophthalate.

The amount of the plasticizer to be contained is desirably from about 0 to 3 percent by weight, more desirably from 0.1 to 2 percent by weight, on the basis of the total amount of the photopolymerizable composition of the invention.

Examples of useful surface active agents are sorbitan monooleate, sorbitan stearate, sorbitan monostearate, sorbitan, sorbitan monolaurate, polyoxyethylene nonylphenyl ether, and polyoxyethylene octylphenyl ether.

The surface active agent is used in an amount desirably from 0 to about 3 percent by weight, more desirably from 0.1 to 2 percent by weight, on the basis of the total amount of the photopolymerizable composition of the invention.

The photopolymerizable composition of the invention is dissolved in one of various organic solvents before being applied to a base.

The organic solvents that may be used are methanol, ethanol, propanol, methylene chloride, ethyl acetate, tetrahydrofuran, N-N-dimethylformamide, ethylene glycol monomethyl ether, ethylene glycol monoethyl ether, methyl cellosolve acetate, ethyl cellosolve acetate, propylene glycol monomethyl ether, propylene glycol monomethyl ether acetate, diacetone alcohol, methyl ethyl ketone, acetone, methyl lactate, etc. These solvents may be used alone or in a combination of two or more.

When the photopolymerizable composition of the invention is used in fabricating a photosensitive lithographic plate, the base may be paper, plastic film, or metallic plate of copper, zinc, aluminum, stainless steel or the like. A composite base combining two or more such materials may be used as well.

Of these bases, particularly desirable are aluminum plates that have been polished by brushing or with balls; brushed and then anodized; electropolished and then anodized; or that have been treated by a combination of these steps.

An aluminum plate thus pretreated as a base may further be posttreated, e.g., by chemical conversion treatment with an alkali silicate, zirconium fluoride, alkyl titanate, trihydroxybenzoic acid or the like; boemite film forming; coating with an aqueous solution of strontium acetate, zinc acetate, magnesium acetate, calcium benzoate, etc.; and coating with polyvinyl pyrrolidone, polyaminosulfonic acid, polyvinyl sulfonic acid, polyacrylic acid, polymethacrylic acid, etc.

The photosensitive layer formed from the photopolymerizable composition of the invention may be protected with a releasable clear cover sheet against the unfavorable effects of oxygen, such as sensitivity drop and deterioration of shelf stability. Alternatively, it is possible to provide a coating layer of a polymer that is slightly permeable to oxygen and can be removed during development, e.g., polyvinyl alcohol, polyvinyl pyrrolidone, water-soluble nylon, or cellulose compound.

A photographic sensitive material using the photopolymerizable composition of the invention is exposed to light through a pattern and, where necessary the hardness of the exposed areas is enhanced by postbaking, and then the unexposed areas are dissolved away by a developing solution to leave an objective image behind.

The developing solution to be used may be chosen from among solvent and aqueous solution types. An alkaline aqueous solution type is preferred.

Suitable alkaline agents for use in the alkaline aqueous solution type developing solution include sodium silicate, potassium silicate, sodium hydroxide, potassium hydroxlic sodium phosphate, tribaide, sodium octoate, tribasic potassium phosphate, dibasic sodium phosphate, dibasic potassium phosphate, sodium metasilicate, sodium orthosilicate, monoethanolamine, diethanolamine, triethanolamine, and tetramethylammonium hydroxide.

The alkaline aqueoussolution type developing solution may contain, when necessary, a cationic or amphoteric surface active agent or/and an orgLnic solvent, such as benzyl alcohol, phenylglycol, or butyl cellosolve, each in a small amount.

The photopolymerizable composition of the invention exhibits high sensitivity over a broad spectral range from ultraviolet to visible rays of light.

The use of the present composition, therefore, permits uv projection exposure and laser scanning exposure for the fabrication of ligthographic plates, and direct computer-to-plate manufacture.

Not only as photosensitive layers for lithographic plates, the photopolymerizable composition of the invention can also be utilized as photoresists and dry films for the fabrication of resin letterpress plates, ICs, LSIs, and the like, photoimaging for relief and copying of images, and further as photosetting inks, coating materials, adhesives, etc.

DETAILED DESCRIPTION OF PREFERRED EMBODIMENTS

Figure 1:
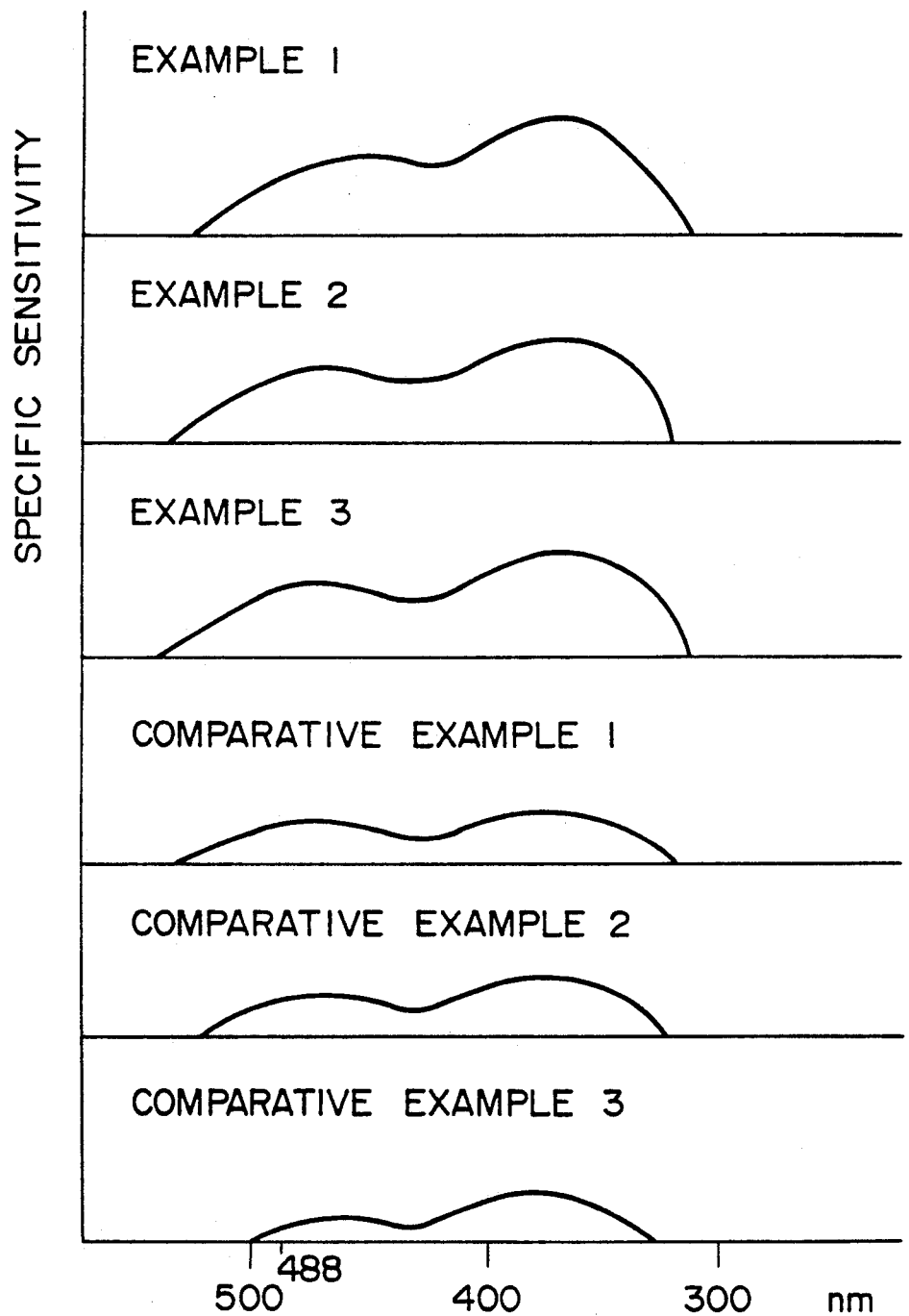
FIG. 1 is a graphic representation of the spectral sensitivities in Examples 1 to 3 and Comparative Examples 1 to 3.

The present invention will be more fully described below in connection with its working examples, which are in no way limitative.

EXAMPLES 1–3 AND COMPARATIVE EXAMPLES 1–3

Pieces of aluminum sheet (grade 1050), measuring 0.24 mm thick and 1000 mm wide were degreased with alkali, polished on the surface with a nylon brush under a spray of an aqueous suspension of silica powder, and then rinsed thoroughly with water.

Next, a 20% caustic soda solution at 70° C was poured over the test pieces for 5seconds to etch the surface at the rate of 3 g/m². The pieces were rinsed with running water, electropolished with an electrolyte composed of 35 g hydrochloric acid, 20 g boric acid and 20 g aluminum ions per liter at a current density of 30 A/dm² and at 25° C. for 30 seconds, and again rinsed with water.

The pieces were again etched on the surface by pouring a 20% caustic soda solution at 70° C., rinsed with water, and anodized in an aqueous solution of 10% sulfuric acid at 30° C. to form an oxide film at the rate of 2.0 g/m².

The aluminum sheets thus pretreated were coated with photopolymerizable compositions of the following compositions, one for each, so that the dry film would weigh 1.5 g/m², and then dried.

| | |
|---|---|
| Styrene-maleic anhydride half-ester (acid value = 270; molecular weight = 1700) | 5 g |
| Pentaerythritol tetraacrylate | 5 |
| One of photoinitiators in Table 1 | x |
| Propylene glycol monomethyl ether | 75 |
| Ethylene glycol monomethyl ether | 75 |

The types and contents of photoinitiators used in Examples 1–3 and Comparative Examples 1–3 are also shown in Table 1.

An aqueous solution of 3% polyvinyl alcohol (a product of the Nippon Synthetic Chemical Industry Co., trade-named "GL-05F") was applied, at he rate of 1.0 g/m², over the photosensitive layers so formed and then dried.

TABLE 1

| Example | Polymerization initiator | Content (g) |
|---|---|---|
| 1 | 2,5-Bis(4'-diethylaminobenzylidene) cyclopentanone | 0.10 |
| | Triphenylphosphine | 0.15 |
| | 2-Mercaptobenzothiazole | 0.20 |

TABLE 1-continued

| Example | Polymerization initiator | Content (g) |
|---|---|---|
| | Compound (1) | 0.10 |
| 2 | 2,6-Bis(4'-diethylaminobenzylidene) cyclohexanone | 0.10 |
| | Allyltriphenylphosphonium chloride | 0.20 |
| | 2-Mercaptobenzothiazole | 0.20 |
| | Compound (2) | 0.10 |
| | Acrylamide | 0.10 |
| 3 | 2,5-Bis(4'-diethylaminobenzylidene) cyclopentanone | 0.10 |
| | Triphenylphosphine | 0.15 |
| | 2-Mercaptobenzothiazole | 0.20 |
| | Compound (3) | 0.10 |
| | Acrylamide | 0.10 |
| Comparative Example 1 | 2,5-Bis(4'-diethylaminobenzylidene) cyclopentanone | 0.10 |
| | Triphenylphosphine | 0.15 |
| | 2-Mercaptobenzothiazole | 0.20 |
| Comparative Example 2 | 2,5-Bis(4'-diethylaminobenzylidene) cyclopentanone | 0.30 |
| | Benzyltriphenylphosphonium chloride | 0.12 |
| | 2-Mercaptobenzothiazole | 0.20 |
| | 2,5-Diphenyl-3-(4-styrylphenyl) tetrazolium chloride | 0.20 |
| Comparative Example 3 | N,N'-Bis(diethylamino)benzophenone | 0.15 |
| | Ketocumalin | 0.15 |
| | 2,4,6-Tris(trichloromethyl)-S-triazine | 0.15 |
| | N-Phenylglycine | 0.15 |

MEASUREMENT OF SPECTRAL SENSITIVITY

A diffraction rating type spectral sensitivity meter, Model RM-23" (manufactured by Mestec Co.), was employed. ON this equipment each aluminum sheet was exposed to light for 15 seconds and then developed by immersion into the bath of a developing solution of the following composition at 25° C. for 30 seconds:

| | |
|---|---|
| Sodium silicate, JIS No. 3 | 25 g |
| Potassium hydroxide | 15 g |
| "Amorgen K" (manufactured by Dai-ichi Kogyo Seiyaku Co.) | 1 g |
| Water | 1 kg |

After rinsing with water, the (spectral) sensitivities of the photosensitive layers of the aluminum sheets at different wavelengths were determined on the basis of the images left on them.

Graphic representations of the spectral sensitivities of the test specimens in Examples 1–3 and Comparative Examples 1–3 are given in FIG. 1.

As is clear from FIG. 1, the photosensitive layers of Examples 1–3 were highly sensitive in the neighborhood of 488 nm, whereas the layers of Comparative Examples 1–3 were all less sensitive.

MEASUREMENT OF SENSITIVITY TO ULTRAVIOLET RAYS

The photosensitive layers of Examples 1–3 and Comparative Examples 1–3 were exposed to ultraviolet rays from a mercury lamp and their sensitivities were determined in the following manner.

A Kodak's step table No. 2 was kept in close contact with each aluminum sheet and was exposed to light from a 2 kW mercury lamp ("Jet Printer" made by Oak & Co.) at a distance of 1.0 m at the rate of 1 mJ/cm². The exposed piece was dipped in the developing solution at 25° C. for 30 seconds (standard development), rinsed with water to remove uncured areas, dried, and the number of completely cured (solid) steps on the tablet was counted.

Table 2 shows the results.

DETERMINATION OF DEVELOPMENT LATITUDE

The test pieces were exposed to light in the same manner as in the measurement of sensitivity to ultraviolet rays. The exposed pieces were immersed in the same developing solution for 2 minutes and were inspected to see how many steps the solid areas shifted as compared with the number of solid steps upon standard development.

The results too are given in Table 2.

The smaller the number of solid steps shifted the greater the development latitude of the sensitive layer.

TABLE 2

| Example | No. of solid steps on standard development | Development latitude |
|---------|---------------------------------------------|----------------------|
| 1       | 7                                           | 1                    |
| 2       | 6                                           | 1                    |
| 3       | 7                                           | 1                    |
| Comp. 1 | 4                                           | 3                    |
| Comp. 2 | 4                                           | 3                    |
| Comp. 3 | 4                                           | 3                    |

Table 2 clearly shows that the photosensitive layers of Examples 1-3 were superior in both ultraviolet-ray sensitivity and development latitude to the layers of Comparative Examples 1-3.

I claim:

1. A photopolymerizable composition which comprises a radical-polymerizable compound having two or more ethylenically unsaturated double bonds in the molecule, a photoinitiator, an organic high-molecular compound, and at least one substituted ethyene compound selected from those having the general formulas (I) and (II):

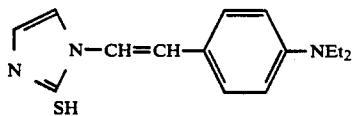
(I)

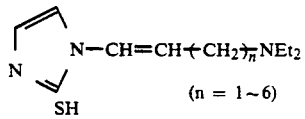
(II)

(n = 1~6)

2. The photopolymerizable composition of claim 1, wherein said substituted ethylene compound is a compound of any one of the following structural formulas:

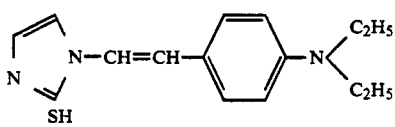

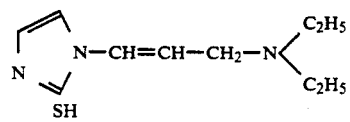

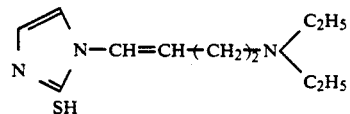

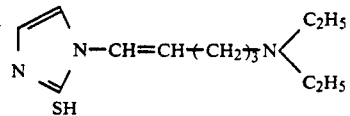

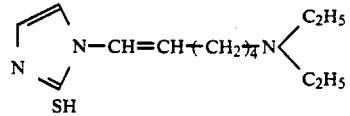

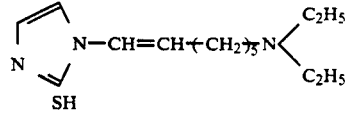

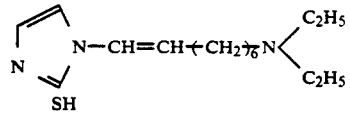

* * * * *